United States Patent
Yagi et al.

(10) Patent No.: US 8,260,388 B2
(45) Date of Patent: Sep. 4, 2012

(54) CURRENT TERMINAL STRUCTURE OF SUPERCONDUCTING WIRE AND SUPERCONDUCTING CABLE HAVING THE CURRENT TERMINAL STRUCTURE

(75) Inventors: Masashi Yagi, Tokyo (JP); Hirao Hirata, Tokyo (JP); Mitsuo Suzuki, Tokyo (JP); Shinichi Mukoyama, Tokyo (JP); Yuh Shiohara, Tokyo (JP)

(73) Assignees: International Superconductivity Technology Center, Tokyo (JP); Furukawa Electric Co., Ltd, Tokyo (JP)

( * ) Notice: Subject to any disclaimer, the term of this patent is extended or adjusted under 35 U.S.C. 154(b) by 0 days.

(21) Appl. No.: 13/243,630

(22) Filed: Sep. 23, 2011

(65) Prior Publication Data
US 2012/0015816 A1    Jan. 19, 2012

Related U.S. Application Data

(63) Continuation of application No. PCT/JP2010/057611, filed on Apr. 28, 2010.

(30) Foreign Application Priority Data

Apr. 28, 2009  (JP) .................... 2009-109808

(51) Int. Cl.
*H01L 39/24*    (2006.01)
(52) U.S. Cl. ...................... 505/232; 174/125.1
(58) Field of Classification Search .............. 505/230, 505/231, 232; 174/125.1
See application file for complete search history.

(56) References Cited

U.S. PATENT DOCUMENTS

| | | | |
|---|---|---|---|
| 2004/0171308 A1* | 9/2004 | Hirose | 439/668 |
| 2004/0211586 A1* | 10/2004 | Sinha et al. | 174/125.1 |
| 2006/0254804 A1* | 11/2006 | Ashibe et al. | 174/125.1 |
| 2007/0137881 A1* | 6/2007 | Ashibe | 174/125.1 |
| 2012/0021917 A1* | 1/2012 | Sakamoto et al. | 505/230 |

FOREIGN PATENT DOCUMENTS

| | | |
|---|---|---|
| JP | 2004-87265 | 3/2004 |
| JP | 2007-266149 | 10/2007 |
| JP | 2008-47519 | 2/2008 |
| JP | 2008-234957 | 10/2008 |
| JP | 2009-16253 | 1/2009 |

OTHER PUBLICATIONS

International Search Report for International Application No. PCT/JP2010/057611, mailing date Jun. 22, 2010, 3 pages.
N. Amemiya, M. Nakahata, Numerical study on AC loss characteristics of superconducting power transmission cables comprising coated conductors with magnetic substrates, Oct. 31, 2006, 6 pages.

* cited by examiner

*Primary Examiner* — Colleen Dunn
(74) *Attorney, Agent, or Firm* — Turocy & Watson, LLP

(57) ABSTRACT

A current terminal structure of a superconductor has a former, and a superconducting wire wound around the former in one or more layers and including a substrate and a superconducting layer formed on the substrate. A first layer superconducting wire wound around immediately above the former is arranged so that a substrate side thereof becomes outside and a superconducting layer side thereof becomes inside. A surface of the superconducting layer at an end of the first layer superconducting wire, which is directed toward the inside, and part of a surface of the superconducting layer of a connection superconducting wire, which is directed toward the outside, are faced and connected to each other.

11 Claims, 8 Drawing Sheets

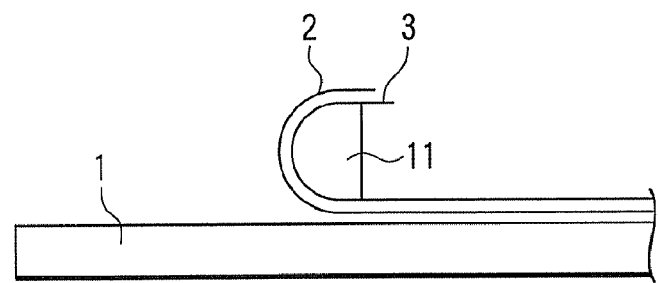
F I G. 6A
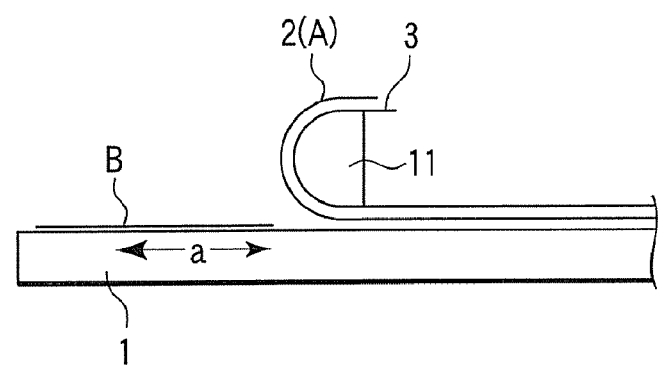
F I G. 6B
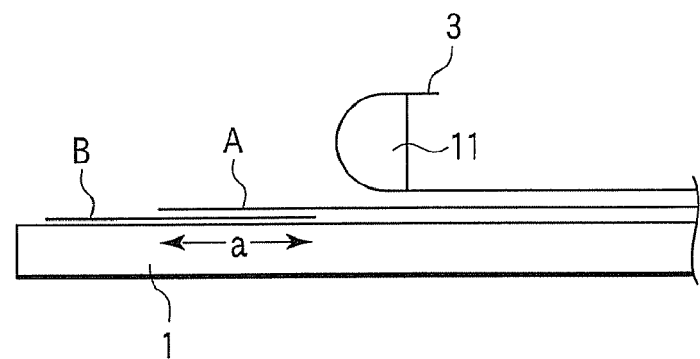
F I G. 6C

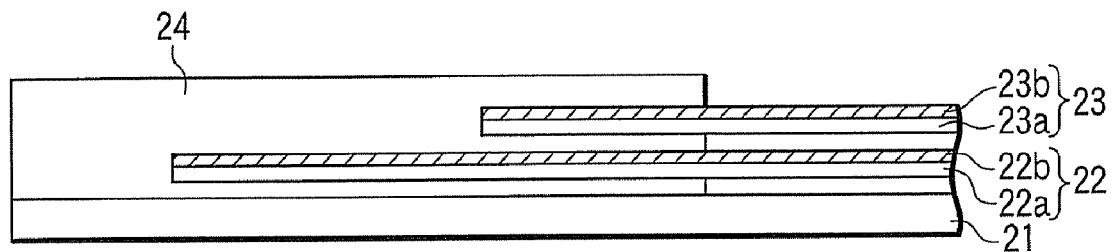
F I G. 7
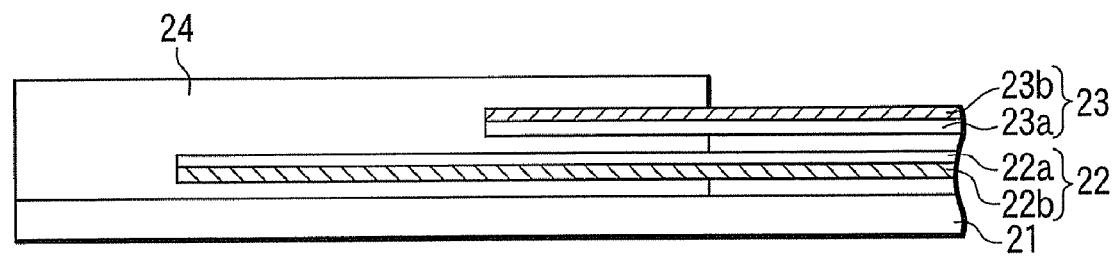
F I G. 8

CURRENT TERMINAL STRUCTURE OF SUPERCONDUCTING WIRE AND SUPERCONDUCTING CABLE HAVING THE CURRENT TERMINAL STRUCTURE

CROSS REFERENCE TO RELATED APPLICATIONS

This application is a Continuation Application of PCT Application No. PCT/JP2010/057611, filed Apr. 28, 2010 and based upon and claiming the benefit of priority from prior Japanese Patent Application No. 2009-109808, filed Apr. 28, 2009, the entire contents of all of which are incorporated herein by reference.

BACKGROUND OF THE INVENTION

1. Field of the Invention

The present invention relates to a current terminal structure of superconducting wires and to a superconducting cable having this current terminal structure.

2. Description of the Related Art

In general, a superconductor has a structure in which a tape-like superconducting wire is wound around a core (former) in multi-layers. This thin film type superconducting wire to be used has a structure in which a superconducting layer formed of ReBCO (Re—Ba—Cu—O, wherein Re is a rare earth metal) for example is deposited, through a buffer layer, on a substrate, and a stabilizing layer formed of silver is deposited on the superconducting layer.

On passing an electric current to this superconductor, it is required to enable the electric current to uniformly flow through each of the superconducting layers of superconducting wires and also required to reduce the connecting resistance of current terminal portion so as to minimize the generation of heat at the connecting portion of the superconductor connected with a current lead for supplying an electric current.

The superconducting wire has a front side and a back side. The connection of the superconducting wire with the current lead at the current terminal is generally executed in such a manner that the superconducting layer side becomes outside or front side. If the superconducting wire is connected with the current lead so that the substrate side becomes outside, a large joule heat is permitted to generate due to a high current resistance of the substrate, thereby deteriorating the current efficiency.

When a magnetic field is applied perpendicular to the surface of a YBCO superconducting wire in which a YBCO (Y—Ba—Cu—O) layer is employed as the superconducting layer, a large AC loss is caused to generate. Namely, when the magnetic field becomes larger, the magnetic field is enabled to penetrate into the superconducting wire, thereby enabling Lorentz's force in the penetrating direction to balance with a pinning force. In the case of AC, since the magnetic field fluctuates periodically and hence moves against the pinning force, AC loss is caused to generate.

However, when a magnetic field is applied parallel to the surface of superconducting wire, the AC loss can be extremely minimized owing to the fact that the superconducting layer is as very thin as around 1 μm so that the region to which the magnetic field is able to penetrate is very thin. For example, when a cable is fabricated by using the YBCO superconducting wire, since a parallel magnetic field is mainly generated, the AC loss can be prominently minimized. However, since the width of actual superconducting wire is limited, a gap is caused to exist between wires in the cross-section of the cable, thereby forcing the magnetic field to be attracted into this gap. As a result, a perpendicular component of a magnetic field is caused to generate at this portion, thereby enabling most of the AC loss to be shared by this portion (see for example, N. Amemiya and Nakhata, Physica C 463-465 (2007) 775-780).

As described above, it is very important to reduce the perpendicular component of the magnetic field on applying the YBCO superconducting wire to electric power equipment.

Meanwhile, where a substrate exhibits magnetism, a magnetic field is attracted to the magnetic substrate, thereby making the magnetic fields depict complicated magnetic lines of force. Namely, a magnetic flux is caused to concentrate at an end of a wire, thereby increasing the vertical magnetic field at this end, resulting in an increase of current loss (see for example, N. Amemiya and Nakhata, Physica C 463-465 (2007) 775-780).

FIG. 7 illustrates a current terminal portion of an ordinary multilayered superconducting cable. In the example shown in FIG. 7, a first superconducting wire 22 constituting a first layer and a second superconducting wire 23 constituting a second layer are spirally wound around a former 21. In this case, the first superconducting wire 22 includes a substrate 22*a* and a superconducting layer 22*b* formed on the substrate 22*a*. Whereas, the second superconducting wire 23 includes a substrate 23*a* and a superconducting layer 23*b* formed on the substrate 23*a*.

The first superconducting wire 22 and second superconducting wire 23 are both disposed in such a manner that the sides of the superconducting layer 22*b* and the superconducting layer 23*b* become outside. The ends of the first superconducting wire 22 and second superconducting wire 23 are bench-cut and integrated by a solder-fixing portion 24, thereby creating a current terminal portion (see for example, JP-A 2004-87265).

According to the current terminal portion constructed in this manner, it is possible to extremely minimize the connecting resistance and, furthermore since the magnitude of shunt to each of superconducting layers can be determined by the manner of winding spiral of the superconducting layers, it is possible to realize uniform shunt through the adjustment of this winding spiral.

FIG. 8 illustrates a current terminal portion of a multilayer superconducting cable having a magnetic substrate. In the example shown in FIG. 8, a first superconducting wire 22 constituting a first layer and a second superconducting wire 23 constituting a second layer are spirally wound around a former 21. In this case however, contrarily to the ordinary arrangement, the first superconducting wire 22 is disposed in such a manner that the side of the magnetic substrate 22*a* thereof becomes outside of the superconducting cable and the second superconducting wire 23 is disposed in such a manner that the side of the superconducting layer 23*b* becomes outside of the superconducting cable. In a conductor constructed in this manner, the influence of magnetism can be contained within the superconductor, thereby making it possible to minimize the AC loss (see for example, JP-A 2008-47519).

However, when the current terminal portion is constructed so that the first superconducting wire 22 is disposed so that the side of the superconducting layer 22*b* becomes inside, the connecting resistance would become larger, thereby making it impossible to enable the first and second superconducting wires to share the same magnitude of electric current. Namely, since the current terminal portion is not provided with a sufficient electrode capacity, joule heat is caused to generate at the moment when the electric current flowing through the second superconducting wire 23 exceeds a critical current Ic, resulting in a great increase in AC loss.

BRIEF SUMMARY OF THE INVENTION

Problems to be Solved by the Invention

It is an object of the present invention to provide a current terminal structure of superconducting wires which is low in connecting resistance and minimal in AC loss and it is another object of the present invention to provide a superconducting cable having this current terminal structure.

Means for Solving the Problems

According to a first aspect of the present invention, there is provided a current terminal structure of a superconductor which comprises a former, and a superconducting wire wound around the former in one or more layers and including a substrate and a superconducting layer formed on the substrate, a first layer superconducting wire wound around above the former being arranged so that a substrate side thereof becomes outside and a superconducting layer side thereof becomes inside, wherein a surface of the superconducting layer at an end of the first layer superconducting wire, which is directed toward the inside, and part of a surface of the superconducting layer of a connection superconducting wire, which is directed toward the outside, are faced and connected to each other.

The current terminal structure of the superconductor comprises a second layer superconducting wire wound around the first layer superconducting wire so that the superconducting layer side becomes outside and the substrate side becomes inside, and a solder-fixing portion in which an exposed portion of the superconducting layer of the connection superconducting wire is integrated with an end of the second layer superconducting wire by making use of a solder.

In this case; it is preferred that an electric resistivity of the solder being employed at the connecting portion between the connection superconducting wire and the first layer superconducting wire as measured at liquid nitrogen temperature is not higher than an electric resistivity of the solder being employed at the solder-fixing portion. Further, it is preferred that a melting point of the solder being employed at the connecting portion between the connection superconducting wire and the first layer superconducting wire is higher than a melting point of the solder being employed at the solder-fixing portion. Then, it is preferred that a connecting length "b" between the connection superconducting wire and the solder-fixing portion and a connecting length "c" between the second layer superconducting wire and the solder-fixing portion are selected to satisfy a relationship of: $b \geq c$.

According to a second aspect of the present invention, there is provided a current terminal structure of a superconductor which comprises a former, and superconducting wires wound around the former in four or more layers and each including a substrate and a superconducting layer formed on the substrate, an odd-numbered layer superconducting wire being arranged so that a substrate side thereof becomes outside and a superconducting layer side thereof becomes inside, wherein a surface of the superconducting layer at an end of the odd-numbered layer superconducting wire, which is directed toward the inside, and part of a surface of the superconducting layer of a connection superconducting wire, which is directed toward the outside, are faced and connected to each other.

The current terminal structure of the superconductor includes an odd-plus one-numbered layer superconducting wire wound on the odd-numbered layer superconducting wire so that the superconducting layer side becomes outside and the substrate side becomes inside, and a solder-fixing portion in which an exposed portion of the superconducting layer of the connection superconducting wire is integrated with an end of the odd-plus one-numbered layer superconducting wire by making use of a solder.

In this case, it is preferred that an electric resistivity of the solder being employed at the connecting portion between the connection superconducting wire and the odd-numbered layer superconducting wire as measured at liquid nitrogen temperature is not higher than an electric resistivity of the solder being employed at the solder-fixing portion. Further, it is preferred that a melting point of the solder being employed at the connecting portion between the connection superconducting wire and the odd-numbered layer superconducting wire is higher than a melting point of the solder being employed at the solder-fixing portion. Then, it is preferred that a connecting length "b" between the connection superconducting wire and the solder-fixing portion and a connecting length "c" between the odd-plus one-numbered layer superconducting wire and the solder-fixing portion are selected to satisfy a relationship of: $b \geq c$.

According to a third aspect of the present invention, there is provided a superconducting cable provided with the current terminal structure described above.

Effects of the Invention

According to the present invention, it is possible to provide a current terminal structure of superconducting wires which is low in connecting resistance and minimal in AC loss and also to provide a superconducting cable having this current terminal structure.

BRIEF DESCRIPTION OF THE SEVERAL VIEWS OF THE DRAWING

FIG. 6A is a schematic view for illustrating the procedure of manufacturing a current terminal structure of superconducting wires according to one embodiment of the present invention;

FIG. 6B is a schematic view for illustrating the procedure of manufacturing a current terminal structure of superconducting wires according to one embodiment of the present invention;

FIG. 6C is a schematic view for illustrating the procedure of manufacturing a current terminal structure of superconducting wires according to one embodiment of the present invention;

FIG. 7 is a cross-sectional view of a current terminal structure of the conventional multi-layered superconducting cable; and FIG. 8 is a cross-sectional view of a current terminal structure of the conventional multi-layered superconducting cable provided with a magnetic substrate.

DETAILED DESCRIPTION OF THE INVENTION

There will now be described specific embodiments of the present invention with reference to drawings.

Figure 1:
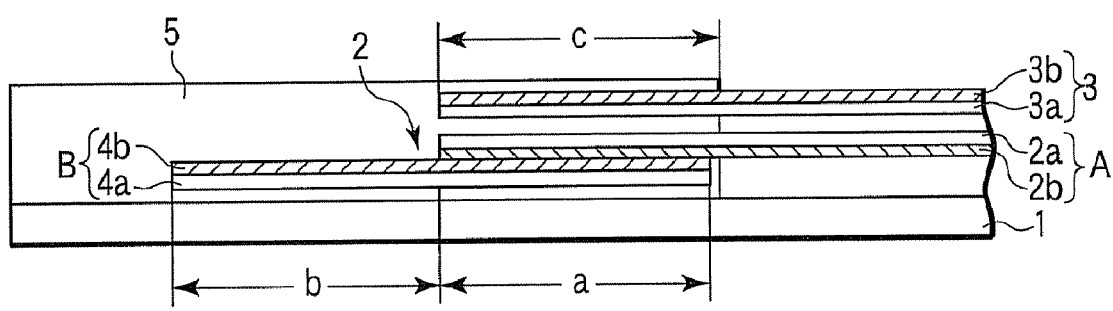
FIG. 1 is a cross-sectional view of a current terminal structure of superconducting wires according to one embodiment of the present invention.

FIG. 1 shows a cross-sectional view of a current terminal structure of a superconducting cable having a two-layer structure according to one embodiment of the present invention. Incidentally, in FIG. 1 (and also in other FIGs.), only an upper half of the superconducting cable is shown and a lower half of the superconducting cable is omitted.

In FIG. 1, a first layer formed of a first superconducting wire 2 and a second layer formed of a second superconducting wire 3 are spirally wound around a former 1. In this case, the first superconducting wire 2 includes a wire A which is composed of a substrate 2a and a superconducting layer 2b formed on the surface of substrate 2a, and a connecting wire B which is electrically connected with an end of the wire A and composed of a substrate 4a and a superconducting layer 4b formed on the surface of substrate 4a. Incidentally, a second layer formed of a second superconducting wire 3 is constituted by a substrate 3a and a superconducting layer 3b formed on the surface of substrate 3a.

In this first superconducting wire 2, the wire A is disposed in such a manner that the side of the substrate 2a becomes outside and the connecting wire B is disposed in such a manner that the side of the superconducting layer 4b becomes outside. Namely, the superconducting layer 2b of the wire A is disposed to face the superconducting layer 4b of the connecting wire B. Further, the second superconducting wire 3 is disposed in such a manner that the side of the superconducting layer 3b becomes outside.

A end of the first superconducting wire 2 and an end of the second superconducting wire 3 arranged in this manner are integrated by means of a solder-fixing portion 5. Incidentally, a specific method of forming a current terminal structure through the integration of the ends of the first superconducting wire 2 and the second superconducting wire 3 will be explained hereinafter.

In the current terminal structure of superconducting wires which is constructed as described above, since the wire A is disposed such that the side of the substrate 2a becomes outside, AC loss can be reduced. Further, since the connecting wire B is disposed such that the side of the superconducting layer 4b becomes outside to thereby enable the superconducting layer 2b of wire A to be in contact with the superconducting layer 4b of connecting wire B, the electric currents flowing through the first superconducting wire 2 and the second superconducting wire 3 become uniform and the connecting resistance thereof can be reduced.

In this case, in the first superconducting wire 2, the melting point of the solder to be used for the connection between the wire A and the connecting wire B may preferably be not lower than the melting point of the solder to be used at the solder-fixing portion 5. Further, the electric resistivity, as measured at liquid nitrogen temperature, of the solder to be employed at the connecting portion between the wire A and the connecting wire B may preferably be not higher than the electric resistivity, as measured at liquid nitrogen temperature, of the solder to be employed at the solder-fixing portion 5. Incidentally, the term "liquid nitrogen temperature" means a temperature to be employed on operating a superconducting cable and the like having a current terminal structure. More specifically, the liquid nitrogen temperature may be around 63 K to 90 K on utilizing liquid nitrogen as a cooling medium.

Further, the connecting length (peeling length) "b" between the connecting superconducting connecting wire B and the solder-fixing portion 5 and the connecting length (peeling length) "c" between the second superconducting wire 3 and the solder-fixing portion 5 may preferably be selected to satisfy a relationship of: $b \geq c$. Incidentally, the value of "c" may be generally not less than 30 mm, more preferably 50 mm to 100 mm as the diameter of the superconductor is confined to 15 mm to 100 mm. On the other hand, the value of "b" may be generally not less than 30 mm, more preferably 50 mm to 110 mm.

As far as the values of the length "a" and the connecting lengths "b" and "c" are selected to satisfy the aforementioned conditions, it is possible to more reliably achieve a uniform current flow of the multi-layered superconductor even if the first superconducting wire 2 is disposed such that the side of the substrate 2a becomes outside. Incidentally, the diameter of the superconductor is intended to mean a diameter of the superconductor including the first superconducting wire 2 wound around the former 1 in the case embodiment as shown in FIG. 1. In other words, the diameter of the superconductor means a diameter of a superconductor provided with the first superconducting wire 2 to which the second superconducting wire 3 is to be connected.

Figure 2:
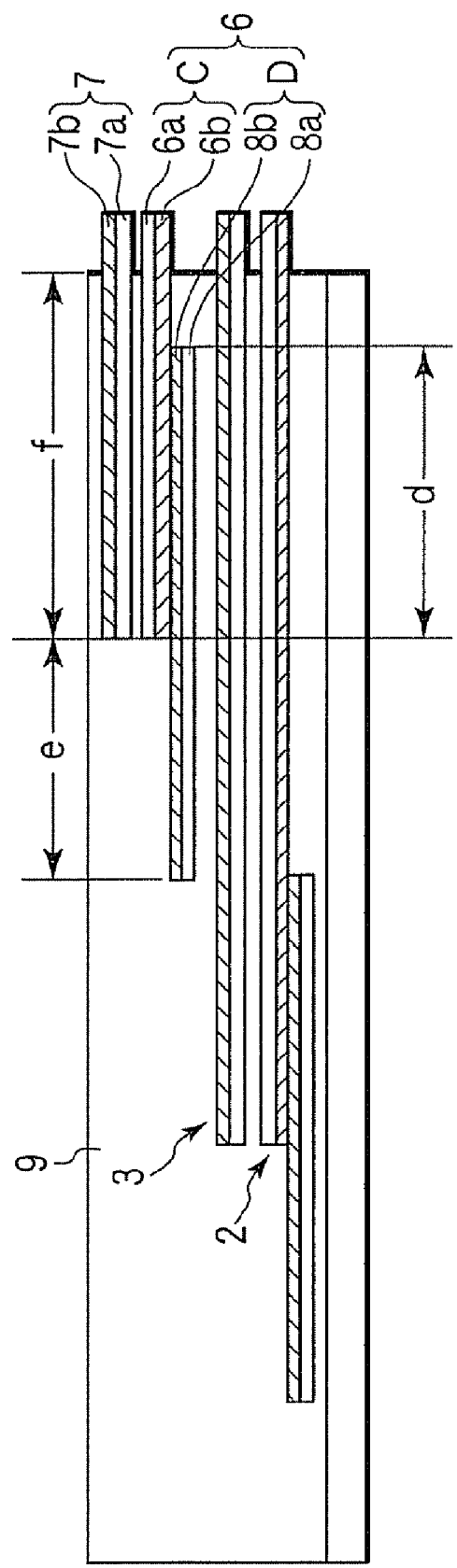
FIG. 2 is a cross-sectional view of a current terminal structure of superconducting wires according to another embodiment of the present invention.

FIG. 2 is a cross-sectional view of a current terminal structure of a superconducting cable having a four-layer structure according to a second embodiment of the present invention. In the superconducting cable shown in FIG. 2, a third layer formed of a third superconducting wire 6 and a fourth layer formed of a fourth superconducting wire 7 are further spirally wound around the superconducting cable shown in FIG. 1, thereby fabricating a superconducting cable having a four-layer structure.

In this case, the construction of the ends of the third layer formed of the third superconducting wire 6 and the fourth layer formed of the fourth superconducting wire 7 is the same as the construction of the ends of the first layer formed of first superconducting wire 2 and the second layer formed of second superconducting wire 3 except that the ends of the third and fourth layers are peeled step-wise to set them backward so as to enable the superconducting layer 3b of second superconducting wire 3 to be exposed outside.

Namely, the third superconducting wire 6 is constituted by a wire C including a substrate 6a and a superconducting layer 6b, and a connecting wire D including a substrate 8a and a superconducting layer 8b. In this third superconducting wire 6, the wire C is disposed in such a manner that the side of the substrate 6a becomes outside and the connecting wire D is disposed in such a manner that the side of the superconducting layer 8b becomes outside. Namely, the superconducting layer 6b of the wire C is disposed to face the superconducting layer 8b of the connecting wire D.

Further, the fourth superconducting wire 7 composed of a substrate 7a and a superconducting layer 7b formed on the surface of the substrate 7a is disposed on the surface of the third superconducting wire 6 in such a manner that the side of the superconducting layer 7b becomes outside.

Terminal portions of the first superconducting wire 2, second superconducting wire 3, third superconducting wire 6 and fourth superconducting wire 7 are integrated by means of a solder-fixing portion 9.

In this case, as far as the third superconducting wire 6 is concerned, the superimposed length (connecting length) formed between an end of the wire C and an end of the connecting wire D may preferably be not less than 50 mm, more preferably 50 mm to 100 mm.

Further, the connecting length "f" between the fourth superconducting wire 7 and the solder-fixing portion 9 and the connecting length "e" between the superconducting connecting wire D and the solder-fixing portion 9 may preferably be selected to satisfy a relationship of: $e \geqq f$. Incidentally, the value of "f" may be generally not less than 30 mm, more preferably 50 mm to 100 mm as the diameter of the superconductor is confined to 15 mm to 100 mm.

On the other hand, the value of "e" may be generally not less than 30 mm, more preferably 50 mm to 110 mm.

As far as the values of the connecting lengths "d", "e" and "f" are selected to satisfy the aforementioned conditions, it is possible to more reliably achieve a uniform current flow of the multi-layered superconductor even if the third superconducting wire 6 is disposed such that the side of the substrate 6a becomes outside.

Figure 3:
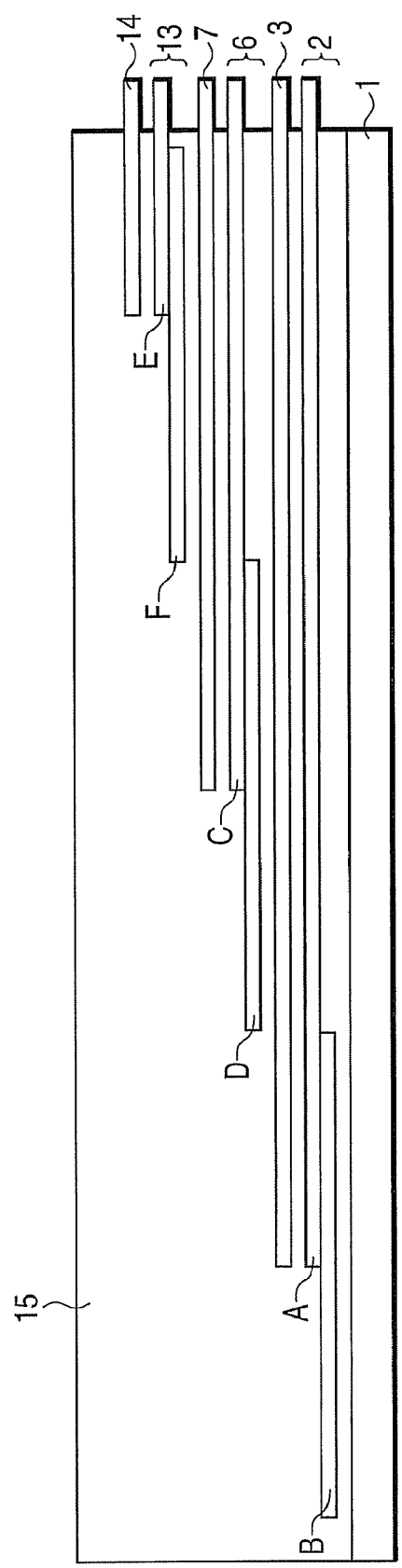
FIG. 3 is a cross-sectional view of a current terminal structure of superconducting wires according to a further embodiment of the present invention.

FIG. 3 is a cross-sectional view of a current terminal structure of a superconducting cable having a six-layer structure according to a third embodiment of the present invention. In the superconducting cable shown in FIG. 3, a fifth layer formed of a fifth superconducting wire 13 and a sixth layer formed of a sixth superconducting wire 14 are further spirally wound around the superconducting cable shown in FIG. 2, thereby fabricating a superconducting cable having a six-layer structure.

In this case, as in the case of the superconducting cable having a four-layer structure, the construction of the ends of the fifth layer formed of the fifth superconducting wire 13 and the sixth layer formed of the sixth superconducting wire 14 is the same as the construction of the ends of the first layer formed of first superconducting wire 2 and the second layer formed of second superconducting wire 3 except that the ends of the fifth and sixth layers are peeled step-wise to set them backward so as to enable the superconducting layer 7b of fourth superconducting wire 7 to be exposed outside.

Namely, the fifth superconducting wire 13 constituting the fifth layer includes a wire E composed of a substrate and a superconducting layer formed on the surface of the substrate, and a connecting wire F electrically connected with an end of the wire E and composed of a substrate and a superconducting layer formed on the surface of the substrate. Furthermore, in this fifth superconducting wire 13, the wire E is disposed in such a manner that the substrate side becomes outside and the connecting wire F is disposed in such a manner that the superconducting layer side becomes outside. Namely, the superconducting layer of the wire E is disposed to face the superconducting layer of the connecting wire F.

Further, the sixth superconducting wire 14 used as the sixth layer and composed of a substrate and a superconducting layer formed on the surface of the substrate is disposed on the fifth superconducting wire 13 in such a manner that the superconducting layer side becomes outside. Terminal portions of the first superconducting wire 2, second superconducting wire 3, third superconducting wire 6, fourth superconducting wire 7, fifth superconducting wire 13 and sixth superconducting wire 14 are integrated by means of a solder-fixing portion 15.

When odd-numbered layers of a superconducting wire to be employed, such as a third layer, a fifth layer or a seventh layer of a superconducting wire have a connecting wire at their ends, and the superconducting layers of these ends are integrated, it is possible to achieve the same effects as described above. The integration of the ends by means of a solder-fixing portion is applied to all of the ends beginning from the end of the first layer of the superconducting wire to the end of an upper-most odd-plus one-numbered layer of the superconducting wire.

In this case, the connecting length "a" between an odd-numbered layer of a superconducting layer and the connecting wire may preferably be not less than 50 mm, more preferably 50 mm to 100 mm. Further, the connecting length "b" between the superconducting wire and the solder-fixing portion and the connecting length "c" between an odd-plus one-numbered layer of the superconducting wire and the solder-fixing portion may preferably be selected to satisfy a relationship of: $b \geqq c$. Incidentally, the value of "c" may be generally not less than 30 mm, more preferably 50 mm to 100 mm as the diameter of the superconductor is confined to 15 mm to 100 mm. On the other hand, the value of "b" may be generally not less than 30 mm, more preferably 50 mm to 110 mm.

Meanwhile, in a case where an odd-numbered layer of a superconducting wire includes a substrate exhibiting magnetism, it is possible to expect the effects thereof. Herein, the term "a substrate exhibiting magnetism" means a metallic substrate which is capable of exhibiting saturation magnetization at an environmental temperature (typically 77 K) suitable for operating a superconductor. Especially, when the saturation magnetization on operating a superconductor is not less than 0.15 T, the effects of the present invention can be sufficiently realized. Incidentally, specific examples of the magnetic metal include ferromagnetic materials represented by Fe, Co, Ni, etc. and alloys based on these metals.

In a case where an odd-numbered layer of a superconducting wire includes a substrate exhibiting magnetism, an even-numbered layer of the superconducting wire may include a substrate exhibiting magnetism or may be formed of a superconducting wire (for example, IBAD wire) which includes a substrate not exhibiting magnetism (for example, Hastelloy (registered trademark)).

Figure 4:
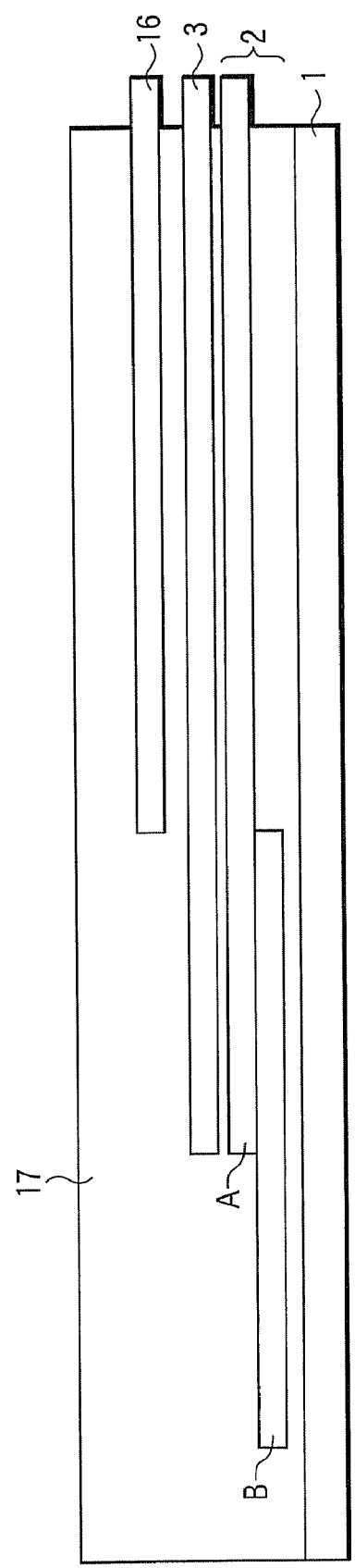
FIG. 4 is a cross-sectional view of a current terminal structure of superconducting wires according to a further embodiment of the present invention.

FIG. 4 is a cross-sectional view of a current terminal structure of a superconducting cable having a three-layer structure according to a fourth embodiment of the present invention. In the superconducting cable shown in FIG. 4, a non-magnetic superconducting wire 16 consisting of a superconducting wire including a substrate not exhibiting magnetism is further spirally wound as a third layer around the superconducting cable shown in FIG. 1, thereby fabricating a superconducting cable having a three-layer structure.

In this case, the construction of the end of the non-magnetic superconducting wire 16 constituting a third layer is peeled step-wise to set it backward so as to enable the superconducting layer 3b of second superconducting wire 3 to be exposed outside.

Terminal portions of the first superconducting wire 2, second superconducting wire 3 and non-magnetic superconducting wire 16 are integrated by means of a solder-fixing portion 17.

Figure 5:
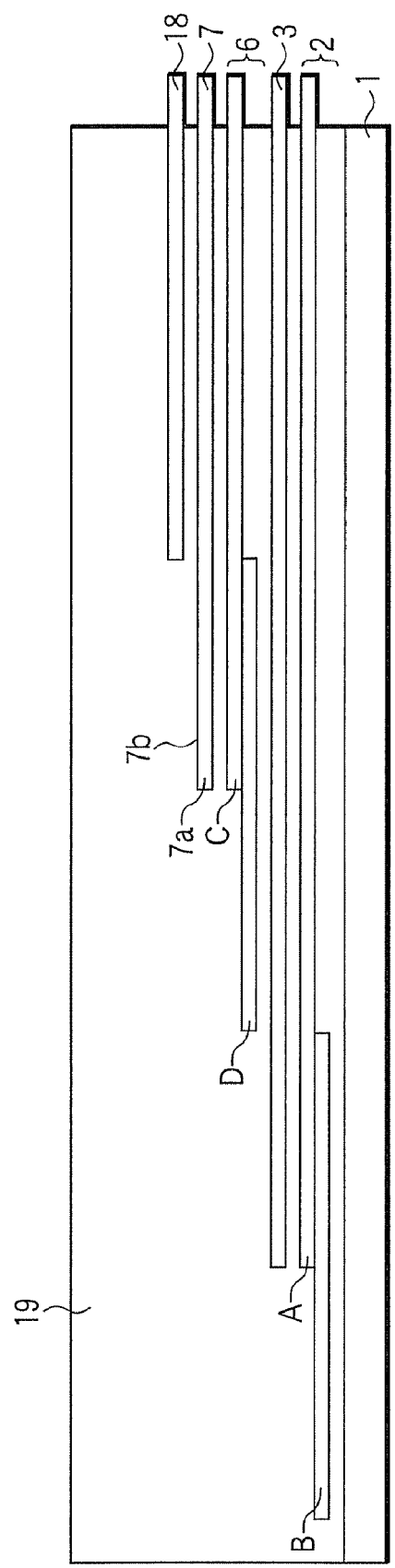
FIG. 5 is a cross-sectional view of a current terminal structure of superconducting wires according to a further embodiment of the present invention.

FIG. 5 is a cross-sectional view of a current terminal structure of a superconducting cable having a fifth-layer structure according to a fifth embodiment of the present invention. In the superconducting cable shown in FIG. 5, a non-magnetic superconducting wire 18 consisting of a superconducting wire including a substrate not exhibiting magnetism is further spirally wound as a fifth layer around the superconducting cable shown in FIG. 2, thereby fabricating a superconducting cable having a fifth-layer structure.

In this case, the construction of the end of the non-magnetic superconducting wire 18 constituting a fifth layer is peeled step-wise to set it backward so as to enable the superconducting layer 7b of fourth superconducting wire 7 to expose outside.

Terminal portions of the first superconducting wire 2, second superconducting wire 3, third superconducting wire 6, fourth superconducting wire 7 and non-magnetic superconducting wire 18 are integrated by means of a solder-fixing portion 19.

In the case of a terminal structure having three or more layers of superconducting wire and the outermost layer thereof is constituted by an odd-numbered layer, when a superconducting wire including a substrate not exhibiting magnetism is employed as the outermost layer thereof, it is no longer required to employ a connecting superconducting connecting wire, thereby making it possible to fabricate a more compact current terminal structure.

Next, a method of forming a solder-fixing portion for integrating superconducting wires located at an end of a superconductor will be explained with reference to FIGS. 6A to 6F.

First of all, the first and the second superconducting wires 2 and 3 which are spirally wound around a former 1 are peeled step-wise as shown in FIG. 6A. Then, the ends of the first and the second superconducting wires 2 and 3 are curled up along with a jig 11 and allowed to leave rearward. Thereafter, as shown in FIG. 6B, a connecting wire B is disposed in such a manner that the superconducting layer side thereof (omitted in FIG. 6B) becomes outside.

Then, the surface of the superconducting layer of connecting wire B is polished to make it flat and smooth and coated with a flux. As for the flux, it is possible to employ, for example, a resin type flux containing no halogen. Thereafter, a thin solder tape having a thickness of 0.1 mm for example is wound around the flux-coated surface. Examples of the solder tape include, for example, a tape of Sn-43Pb-14Bi having a melting point (liquidus curve) of 165° C.

Thereafter, as shown in FIG. 6C, the rearwardly curled end of wire A of the first superconducting wire 2 constituting a first layer is released from the jig 11 and superimposed on the solder tape. Then, a presser tape and a heater are wound around the resultant body. The power source of the heater is turned ON to heat the resultant body at a temperature of not lower than the melting point of the solder tape. As the solder tape is melted due to this heating, the superconducting layer of connecting wire B is enabled to adhere to the superconducting layer of first superconducting wire 2.

Figure 6D:
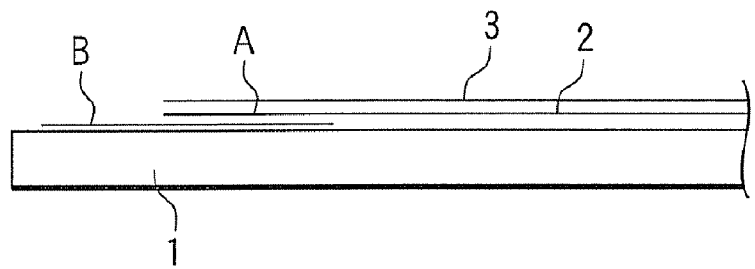
FIG. 6D is a schematic view for illustrating the procedure of manufacturing a current terminal structure of superconducting wires according to one embodiment of the present invention.

Then, as shown in FIG. 6D, the second layer formed of the second superconducting wire 3 is turned back to the surface of the end of first superconducting wire 2 which has been adhered by means of the solder tape. On this occasion, the peeling length "b" of the second superconducting wire 3 is adjusted relative to the peeling length "c" of the connecting wire B so as to satisfy the relationship of: $b \geqq c$.

The resultant structure as shown in FIG. 6D is then subjected to a treatment for achieving electrical connection between the first superconducting wire 2 and the second superconducting wire 3 in one operation. Explanations for achieving this procedure follow.

Figure 6E:
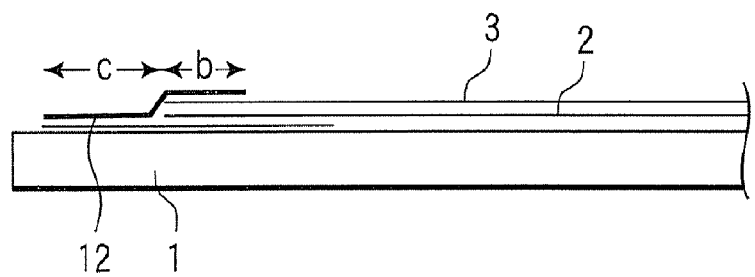
FIG. 6E is a schematic view for illustrating the procedure of manufacturing a current terminal structure of superconducting wires according to one embodiment of the present invention.

As shown in FIG. 6E, a mesh tape 12 is wound around the structure as shown in FIG. 6D one to plural layers so as to cover the peeled length "b" of the second superconducting wire 3 as well as the peeled length "c" of the connecting wire B. This mesh tape 12 is formed of a knitted metallic fine wire exhibiting excellent electric conductivity. For example, a plain stitch tape made of copper wire can be preferably employed.

Then, a solder made of a low melting point metal (for example, Sn-43Pb-14Bi) is heated to melt, thereby enabling the solder to penetrate into the mesh of mesh tape 12. As a result, the mesh tape 12, the second superconducting wire 3 and the connecting wire B are bonded to each other by means of the solder, thereby achieving the integration of the ends of the first superconducting wire 2 and the second superconducting wire 3. The reference number 5 represents a solder-fixing portion.

Figure 6F:
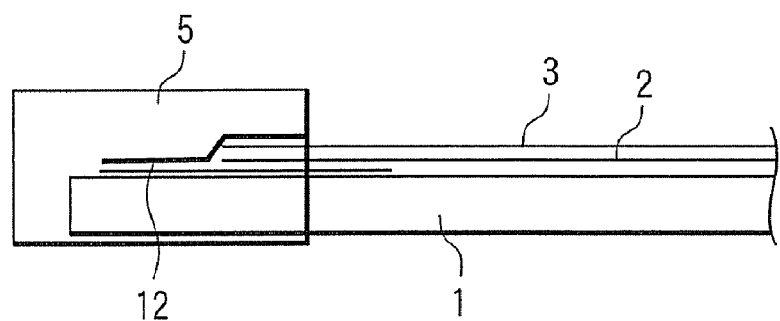
FIG. 6F is a schematic view for illustrating the procedure of manufacturing a current terminal structure of superconducting wires according to one embodiment of the present invention.

This integrating operation can be carried out as shown in FIG. 6F for instance. Namely, the connecting wire B and the second layer of second superconducting wire 3, which are covered with the mesh tape 12, are dipped in the molten solder contained in a crucible, thereby enabling the solder to penetrate through the mesh tape 12 into the connecting wire B and the second superconducting wire 3. Incidentally, it is also possible to employ, in place of the mesh tape 12, fine metallic wires which are not formed into a mesh but are excellent in electric conductivity, the fine metallic wires being wound around the peeled portions of the connecting wire B and the second superconducting wire 3.

The integration of the ends of the first and the second superconducting wires 2 and 3 as described above is advantageous in that since the thickness of the solder which is relatively high in electric resistance can be reduced, the connecting resistance at the terminal regions of the first and the second superconducting wires 2 and 3 can be prominently minimized. Furthermore, since the metallic fine wires exhibiting excellent electric conductivity and constituting the mesh tape 12 act as a passageway of electric current, the connecting resistance at the ends of the first and the second superconducting wires 2 and 3 can be made uniform.

Herein, the solder for integrating the ends of the first and the second superconducting wires 2 and 3 to form the solder-fixing portion 5 may preferably be one having a lower melting point than that of the solder to be used for connecting the wire A of the first superconducting wire 2 with the connecting wire B. This difference in melting point may preferably be as large as possible. With respect to the working temperature to be employed on the integration, it may preferably be not higher than the melting temperature of the solder used in the connection between the wire A of the first superconducting wire 2 and the connecting wire B.

Further, the solder to be employed on connecting the wire A of the first superconducting wire 2 to the connecting wire B may preferably be selected from low melting point metals exhibiting a melting point (liquidus curve) of not higher than 250° C. As explained above, a solder tape is placed on the connecting wire B and the wire A of the first superconducting wire 2 is placed on this solder tape. Under this condition, the connecting wire B and the first layer formed of the first superconducting wire 2 are heated at a temperature higher than the melting point of the solder tape. If the temperature of heating on this occasion is relatively high, the connecting wire B and the superconducting layer of the first superconducting wire 2 may be deteriorated. Therefore, the solder to be employed on connecting the wire A of the first superconducting wire 2 to the connecting wire B may preferably be selected from low melting point metals. When the heat resistance of the superconducting wire is taken into account, the melting point of the solder may preferably be lower than 200° C.

Incidentally, in the following examples, solders 1 to 5 described in the following Table 1 were employed. The room temperature in this Table 1 was 25° C. and the temperature of liquid nitrogen was 77 K.

TABLE 1

| | Composition [wt %] | Melting point [° C.] | Resistivity at room temp. [Ωm] | Resistivity at temp. of liquid nitrogen [Ωm] |
|---|---|---|---|---|
| Solder 1 | So – 14Bi – 43Pb | 165 | $2.00 \times 10^{-7}$ | $6.55 \times 10^{-8}$ |
| Solder 2 | Sn – 35Bi – 40Pb | 120 | $3.38 \times 10^{-7}$ | $1.53 \times 10^{-7}$ |
| Solder 3 | Sn – 57Bi | 139 | $4.42 \times 10^{-7}$ | $1.34 \times 10^{-7}$ |
| Solder 4 | Sn – 60Pb | 190 | $1.41 \times 10^{-7}$ | $2.95 \times 10^{-8}$ |
| Solder 5 | Sn – 0.7Cu – 0.05Ni + Ge | 227 | $1.20 \times 10^{-7}$ | $2.40 \times 10^{-8}$ |

Following products were used as the solders 1 to 5 shown in above Table 1.
Solder 1: BI165 (Nippon Speria Co., Ltd.)
Solder 2: Low temperature Plastan 120 (Aoki Metal Co., Ltd.)
Solder 3: BI57 (Nippon Speria Co., Ltd.)
Solder 4: H60A (Aoki Metal Co., Ltd.)
Solder 5: SN100C (Nippon Speria Co., Ltd.)

EXAMPLE

Shown below are specific examples of the present invention for more specifically explaining the present invention and the effects to be derived therefrom.

Example 1

A first superconducting wire constituting a first layer was spirally wound around a former having a diameter of 20 mm and wound in such a manner that the substrate side became outside. Incidentally, as for the material for the first and the second superconducting wires, a YBCO wire having a YBCO layer formed on the surface of a magnetic substrate made of Ni5W was employed.

Then, a second layer formed of the superconducting wire having the same structure as that of the first superconducting wire constituting the first layer was spirally wound around the former in such a manner that the superconducting layer side became outside.

Thereafter, according to the method shown in FIG. 3, the ends of the first and the second superconducting wires were integrated by making use of a wire A mesh tape and a tape-like solder selected from the solders 1 to 5 shown in Table 1, thereby obtaining a structure as shown in FIG. 1. In this case, the kind of the solder (hereinafter, referred to as a connecting portion of wires) to be employed on connecting the first superconducting wire 2 to the connecting wire B, the kind of the solder for forming the solder-fixing portion 5, and the connecting length "a" where an end of the wire A of the first superconducting wire 2 is superimposed on an end of the connecting wire B were variously changed to obtain various samples shown in Table 2.

Incidentally, the diameter of the superconductor (the diameter of the superconductor formed by winding the first superconducting wire) was set to 50 mm, and the peeling length "b" of the second superconducting wire (the connecting length between the second superconducting wire and the solder-fixing portion) was made equal to the peeling length "c" of the connecting wire B (the connecting length between the connecting wire B and the solder-fixing portion), and the thickness of the solder at the connecting portion between the wire A of the first superconducting wire 2 and the connecting wire B was set to 0.1 mm.

An electric current of about 1000 A was passed to each of these samples in the liquid nitrogen to measure the shunt ratio between the first superconducting wire and the second superconducting wire, thereby obtaining the results shown in the following Table 2.

TABLE 2

| | Type of solder | | Working | Shunt | Shunt | |
| | Connecting portion of wires | Solder-fixing portion | temp. for integration [° C.] | to the 1st superconducting wire [%] | to the 2nd superconducting wire [%] | Distance of "a" [mm] |
|---|---|---|---|---|---|---|
| Sample 1-1 | Solder 1 | Solder 1 | 200 | 35 | 65 | 30 |
| Sample 1-2 | Solder 1 | Solder 1 | 200 | 40 | 60 | 40 |
| Sample 1-3 | Solder 1 | Solder 1 | 200 | 48 | 52 | 50 |
| Sample 1-4 | Solder 1 | Solder 1 | 200 | 49 | 51 | 60 |
| Sample 1-5 | Solder 1 | Solder 2 | 200 | 48 | 52 | 30 |
| Sample 1-6 | Solder 1 | Solder 2 | 200 | 49 | 51 | 40 |
| Sample 1-7 | Solder 1 | Solder 2 | 200 | 50 | 50 | 50 |
| Sample 1-8 | Solder 1 | Solder 2 | 200 | 50 | 50 | 60 |
| Sample 1-9 | Solder 1 | Solder 2 | 160 | 50 | 50 | 30 |
| Sample 1-10 | Solder 1 | Solder 2 | 160 | 50 | 50 | 40 |
| Sample 1-11 | Solder 1 | Solder 2 | 160 | 50 | 50 | 50 |
| Sample 1-12 | Solder 1 | Solder 2 | 160 | 50 | 50 | 60 |
| Sample 1-13 | Solder 4 | Solder 1 | 200 | 48 | 52 | 30 |
| Sample 1-14 | Solder 4 | Solder 1 | 200 | 49 | 51 | 40 |
| Sample 1-15 | Solder 4 | Solder 1 | 200 | 50 | 50 | 50 |
| Sample 1-16 | Solder 4 | Solder 1 | 200 | 50 | 50 | 60 |

TABLE 2-continued

|  | Type of solder | | Working | Shunt | Shunt | |
|---|---|---|---|---|---|---|
|  | Connecting portion of wires | Solder-fixing portion | temp. for integration [° C.] | to the 1st superconducting wire [%] | to the 2nd superconducting wire [%] | Distance of "a" [mm] |
| Sample 1-17 | Solder 4 | Solder 2 | 160 | 50 | 50 | 30 |
| Sample 1-18 | Solder 4 | Solder 2 | 160 | 50 | 50 | 40 |
| Sample 1-19 | Solder 4 | Solder 2 | 160 | 50 | 50 | 50 |
| Sample 1-20 | Solder 4 | Solder 2 | 160 | 50 | 50 | 60 |
| Sample 1-21 | Solder 5 | Solder 3 | 200 | 50 | 50 | 30 |
| Sample 1-22 | Solder 5 | Solder 3 | 200 | 50 | 50 | 40 |
| Sample 1-23 | Solder 5 | Solder 3 | 200 | 50 | 50 | 50 |
| Sample 1-24 | Solder 5 | Solder 3 | 200 | 50 | 50 | 60 |
| Sample 1-25 | Solder 5 | Solder 2 | 160 | 50 | 50 | 30 |
| Sample 1-26 | Solder 5 | Solder 2 | 160 | 50 | 50 | 40 |
| Sample 1-27 | Solder 5 | Solder 2 | 160 | 50 | 50 | 50 |
| Sample 1-28 | Solder 5 | Solder 2 | 160 | 50 | 50 | 60 |
| Sample 1-29 | Solder 1 | Solder 4 | 230 | 30 | 70 | 30 |
| Sample 1-30 | Solder 1 | Solder 4 | 230 | 34 | 66 | 40 |
| Sample 1-31 | Solder 1 | Solder 4 | 230 | 39 | 61 | 50 |
| Sample 1-32 | Solder 1 | Solder 4 | 230 | 42 | 58 | 60 |

It will be recognized from above Table 2 that although the shunt to the first layer superconducting wire and to the second layer superconducting wire was achieved at an acceptable ratio in all of these samples, more preferable shunt was achieved in a case where the kind of the solder employed at the connecting portion of wires was the same as that of the solder employed at the solder-fixing portion and also in a case where the connecting length (distance "a") of the wires was made longer as seen in the samples 1-1 to 1-4. On the other hand, as seen from the samples 1-5 to 1-28, when the kind of the solder employed at the connecting portion of wires was different from that of the solder employed at the solder-fixing portion and also when the electric resistivity, as measured at liquid nitrogen temperature, of the solder employed at the connecting portion was lower than that of the solder-fixing portion, the dependency of the shunt on the connecting length (distance "a") of the wires would be reduced. Especially, as seen from the samples 1-9 to 1-12 and 1-17 to 1-28, when the working temperature for achieving the integration of the ends of wires was regulated to lower than the melting point of the solder employed at the connecting portion of wires, it was possible to further minimize the dependency of the shunt on the connecting length. In order to control the working temperature for achieving the integration of the ends of wires in this manner, the melting point of the solder to be employed at the connecting portion between the connecting wire B and the wire A of the first superconducting wire 2 may preferably be higher than the melting point of the solder to be employed at the solder-fixing portion.

On the other hand, as seen from the samples 1-29 to 1-32, even when the kind of the solder employed at the connecting portion of wires was different from that of the solder employed at the solder-fixing portion, when the electric resistivity, as measured at liquid nitrogen temperature, of the solder employed at the connecting portion of wires was higher than that of the solder-fixing portion, the dependency of the shunt on the connecting length would be increased.

Incidentally, when effects on the environment were taken into account, the solder to be employed may preferably be Pb-free. In this case, as seen from the samples 1-21 to 1-24, the solder to be used at the connecting portion may preferably be selected from Pb-free solders which are lower in electric resistivity in liquid nitrogen than the solder to be used at the solder-fixing portion and are the same in kind as the solder to be used at the solder-fixing portion.

Incidentally, the electric resistance of the connecting portion of wires can be adjusted according to "Electric resistivity of solder×Thickness of solder÷Cross-sectional area of connecting portion". As described above, although the solder to be used at the connecting portion of wires may preferably be selected from, even among low melting point solders, especially those exhibiting a relatively high melting point and a lower electric resistivity relative to the solder-fixing portion, it is preferable, when the influence of heat to the superconducting wire is taken into account, to employ Solder 1 rather than Solder 5.

Further, as for the configuration of the solder to be employed for the electric connection between the wire A of first superconducting wire 2 and the connecting wire B, it is preferable to employ a tape-like solder. In this case, as the thickness of tape solder become thinner, it becomes more difficult to manufacture it.

Namely, since the kinds of solder (electric resistivity) and the thickness of tape solder are restricted at the connecting portion of wires, it is most preferable to adjust the connecting length "a" between the connection superconducting wire and the first layer superconducting wire on adjusting the electric resistance of the connecting portion of wires. However, when the connecting length "a" is increased, the solder-fixing region of the current terminal would become larger, making it undesirable in terms of compactness. Therefore, the connecting length "a" may preferably be confined to 50 mm to 100 mm or so.

Comparative Example 1

In the same manner as described in Example 1, a first layer formed of a first superconducting wire and a second layer formed of a second superconducting wire are spirally wound around a former. Then, contrary to Example 1, the integration of the ends was performed by making use of a mesh tape and a solder without using the connecting wire B, thereby obtaining a sample having a construction as shown in FIG. 8.

An electric current was passed to this sample in the liquid nitrogen to measure the shunt ratio between the first superconducting wire and the second superconducting wire. As a result, the shunt to the first superconducting wire was less than 1% and the shunt to the second superconducting wire was not less than 99%, thus indicating that the shunt to the first superconducting wire was scarcely achieved.

As a reference example, a non-magnetic substrate was used in both of the first superconducting wire constituting a first layer and the second superconducting wire constituting a second layer and then these first and second superconducting wires were spirally wound around a former so that the superconducting layer side becomes outside. Thereafter, the ends thereof were integrated in the same manner as in Comparative Example 1 to obtain a sample having a construction as shown in FIG. 7.

An electric current was passed to this sample in the liquid nitrogen to measure the shunt ratio between the first superconducting wire and the second superconducting wire. As a result, the shunt to the first superconducting wire was 50% and the shunt to the second superconducting wire was 50%, thus indicating uniform shunt to these wires.

Example 2

In the same manner as described in Example 1, a structure as shown in FIG. 1 was obtained. In this case however, the relationship between the peeling length "b" of the second superconducting wire (the connecting length between the second superconducting wire and the solder-fixing portion) and the peeling length "c" of the connecting wire B (the connecting length between the connecting wire B and the solder-fixing portion) was variously changed to obtain seven samples. Incidentally, one of these samples was designed to have a relationship of: b<c+10 (mm), two of them exhibiting a relationship of: b=c, two of them exhibiting a relationship of: b>c+10 (mm), and remaining two of them exhibiting a relationship of: b>c+100 (mm).

An electric current was passed to each of these samples in the liquid nitrogen to measure the shunt ratio between the first superconducting wire and the second superconducting wire, thereby obtaining the results shown in the following Table 3.

TABLE 3

| a = 50 mm | | Shunt to the 1st superconducting wire | Shunt to the 2nd superconducting wire |
| --- | --- | --- | --- |
| Sample 2-1 | b < c + 10 | 45% | 55% |
| Sample 2-2 | b = c | 48% | 52% |
| Sample 2-3 | b = c | 49% | 51% |
| Sample 2-4 | b > c + 10 | 49% | 51% |
| Sample 2-5 | b > c + 10 | 49% | 51% |
| Sample 2-6 | b > c + 100 | 50% | 50% |
| Sample 2-7 | b > c + 100 | 50% | 50% |

It will be recognized from above Table 3 that although the shunt to the first superconducting wire and to the second superconducting wire was achieved at an acceptable ratio in all of these samples, an especially uniform shunt was achieved in a case where b=c or b>c.

What is claimed is:

1. A current terminal structure of a superconductor which comprises a former, and a superconducting wire wound around the former in one or more layers and including a substrate and a superconducting layer formed on the substrate, a first layer superconducting wire wound around immediately above the former being arranged so that a substrate side thereof becomes outside and a superconducting layer side thereof becomes inside, wherein a surface of the superconducting layer at an end of the first layer superconducting wire, which is directed toward the inside, and part of a surface of the superconducting layer of a connection superconducting wire, which is directed toward the outside, are faced and connected to each other.

2. The current terminal structure of a superconductor according to claim 1, wherein a second layer superconducting wire is wound around the first layer superconducting wire so that the superconducting layer side becomes outside and the substrate side becomes inside, and an exposed portion of the superconducting layer of the connection superconducting wire is integrated with an end of the second layer superconducting wire by making use of a solder, thereby providing a solder-fixing portion.

3. The current terminal structure of a superconductor according to claim 2, wherein an electric resistivity of the solder being employed at the connecting portion between the connection superconducting wire and the first layer superconducting wire as measured at liquid nitrogen temperature is not higher than an electric resistivity of the solder being employed at the solder-fixing portion.

4. The current terminal structure of a superconductor according to claim 2, wherein a melting point of the solder being employed at the connecting portion between the connection superconducting wire and the first layer superconducting wire is higher than a melting point of the solder being employed at the solder-fixing portion.

5. The current terminal structure of a superconductor according to claim 2, wherein a connecting length "b" between the connection superconducting wire and the solder-fixing portion and a connecting length "c" between the second layer superconducting wire and the solder-fixing portion are selected to satisfy a relationship of: b≧c.

6. A current terminal structure of a superconductor which comprises a former, and a superconducting wire wound around the former in four or more layers and including a substrate and a superconducting layer formed on the substrate, an odd-numbered layer superconducting wire being arranged so that a substrate side thereof becomes outside and a superconducting layer side thereof becomes inside, wherein a surface of the superconducting layer at an end of the odd-numbered layer superconducting wire, which is directed toward the inside, and part of a surface of the superconducting layer of a connection superconducting wire, which is directed toward the outside, are faced and connected to each other.

7. The current terminal structure of a superconductor according to claim 6, wherein an odd-plus one-numbered layer superconducting wire is wound on the odd-numbered layer superconducting wire so that the superconducting layer side becomes outside and the substrate side becomes inside, and in that an exposed portion of the superconducting layer of the connection superconducting wire is integrated with an end of the odd-plus one-numbered layer superconducting wire by making use of a solder, thereby providing a solder-fixing portion.

8. The current terminal structure of a superconductor according to claim 7, wherein an electric resistivity of the solder being employed at the connecting portion between the connection superconducting wire and the odd-numbered layer superconducting wire as measured at liquid nitrogen temperature is not higher than an electric resistivity of the solder being employed at the solder-fixing portion.

9. The current terminal structure of a superconductor according to claim 7, wherein a melting point of the solder being employed at the connecting portion between the connection superconducting wire and the odd-numbered layer superconducting wire is higher than a melting point of the solder being employed at the solder-fixing portion.

10. The current terminal structure of a superconductor according to claim 7, wherein a connecting length "b" between the connection superconducting wire and the solder-fixing portion and a connecting length "c" between the odd-plus one-numbered layer superconducting wire and the solder-fixing portion are selected to satisfy a relationship of: b≧c.

11. A superconducting cable wherein it is provided with the current terminal structure defined in claim 1.

* * * * *